United States Patent
Lin et al.

(10) Patent No.: US 11,527,275 B2
(45) Date of Patent: Dec. 13, 2022

(54) CRYSTAL SEED LAYER FOR MAGNETIC RANDOM ACCESS MEMORY (MRAM)

(71) Applicant: Taiwan Semiconductor Manufacturing Co., Ltd., Hsin-Chu (TW)

(72) Inventors: Tsann Lin, Hsin-Chu (TW); Ji-Feng Ying, Hsinchu (TW); Chih-Chung Lai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 579 days.

(21) Appl. No.: 16/503,692

(22) Filed: Jul. 5, 2019

(65) Prior Publication Data

US 2020/0098408 A1 Mar. 26, 2020

Related U.S. Application Data

(60) Provisional application No. 62/736,701, filed on Sep. 26, 2018.

(51) Int. Cl.
| | |
|---|---|
| G11C 11/16 | (2006.01) |
| H01L 43/10 | (2006.01) |
| H01F 10/32 | (2006.01) |
| H01L 43/12 | (2006.01) |
| H01L 27/22 | (2006.01) |
| H01L 43/02 | (2006.01) |
| H01F 41/34 | (2006.01) |

(52) U.S. Cl.
CPC ........ *G11C 11/161* (2013.01); *H01F 10/3259* (2013.01); *H01F 10/3286* (2013.01); *H01F 41/34* (2013.01); *H01L 27/228* (2013.01); *H01L 43/02* (2013.01); *H01L 43/10* (2013.01); *H01L 43/12* (2013.01)

(58) Field of Classification Search
CPC ............... G11C 11/161; H01F 10/3254; H01F 10/3286; H01F 41/34; H01L 27/228; H01L 43/02; H01L 43/10; H01L 43/12
See application file for complete search history.

(56) References Cited

U.S. PATENT DOCUMENTS

| | | |
|---|---|---|
| 7,488,609 B1 | 2/2009 | Lin et al. |
| 2003/0030434 A1 | 2/2003 | Hasegawa et al. |
| 2010/0200900 A1 | 8/2010 | Iwayama |
| 2011/0014500 A1* | 1/2011 | Horng ............... H01L 43/08 428/846.3 |
| 2012/0299134 A1 | 11/2012 | Jan et al. |
| 2014/0061828 A1 | 3/2014 | Lim et al. |
| 2015/0325783 A1* | 11/2015 | Wang ............... H01L 43/10 257/421 |
| 2016/0020250 A1 | 1/2016 | Li et al. |

(Continued)

*Primary Examiner* — David C Spalla

(74) *Attorney, Agent, or Firm* — Eschweiler & Potashnik, LLC

(57) ABSTRACT

Some embodiments relate to a memory device. The memory device includes a magnetoresistive random-access memory (MRAM) cell comprising a magnetic tunnel junction (MTJ). The MTJ device comprises a stack of layers, comprising a bottom electrode disposed over a substrate. A seed layer disposed over the bottom electrode. A buffer layer is disposed between the bottom electrode and the seed layer. The buffer layer prevents diffusion of a diffusive species from the bottom electrode to the seed layer.

20 Claims, 7 Drawing Sheets

(56) References Cited

U.S. PATENT DOCUMENTS

| | | |
|---|---|---|
| 2016/0181508 A1 | 6/2016 | Lee et al. |
| 2016/0211440 A1 | 7/2016 | Siddik et al. |
| 2016/0248003 A1 | 8/2016 | DeBrosse et al. |
| 2016/0365505 A1* | 12/2016 | Lu .......................... H01L 43/12 |
| 2016/0380183 A1 | 12/2016 | Chuang et al. |
| 2017/0148977 A1* | 5/2017 | Zhu ........................ H01F 10/16 |

* cited by examiner

CRYSTAL SEED LAYER FOR MAGNETIC RANDOM ACCESS MEMORY (MRAM)

REFERENCE TO RELATED APPLICATION

This Application claims priority to U.S. Provisional Application No. 62/736,701, filed on Sep. 26, 2018, the contents of which are hereby incorporated by reference in their entirety.

BACKGROUND

Many modern day electronic devices contain electronic memory, such as hard disk drives or random access memory (RAM). A magnetic random access memory (MRAM) device includes an array of densely packed MRAM cells. In each MRAM cell, a magnetic tunneling junction (MTJ) element is integrated with a transistor to store data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
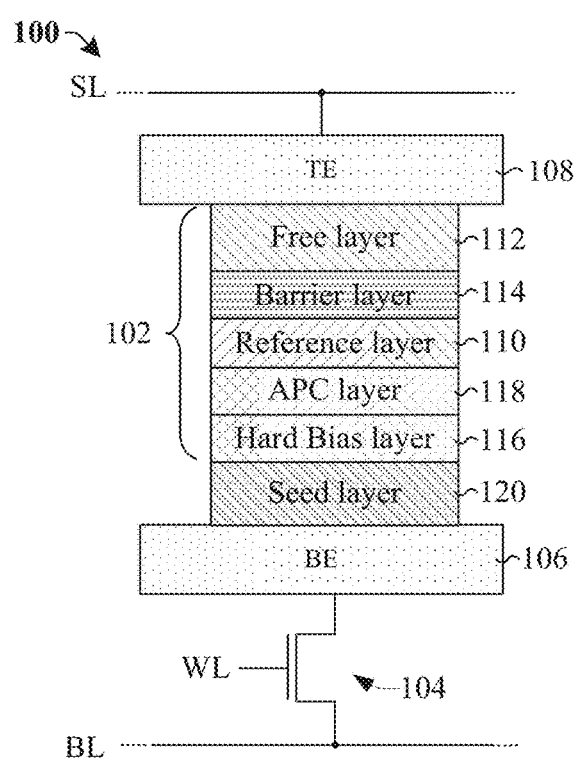
FIG. 1A illustrates a cross-sectional view of some embodiments of a memory device including a magnetic tunneling junction (MTJ) stack formed over a seed layer, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and/or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) stack includes first and second ferromagnetic films separated by a barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the barrier layer, such that the MTJ stack is in a low-resistance state. Conversely, if the magnetization directions of the reference layer and free layer are in an anti-parallel orientation, it is less likely that electrons will tunnel through the tunnel barrier layer, such that the MTJ stack is in a high-resistance state. Consequently, the MTJ stack can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). Because of this binary nature, MTJ stacks are used in memory cells to store digital data, with the low resistance state $R_P$ corresponding to a first data state (e.g., logical "0"), and the high-resistance state $R_{AP}$ corresponding to a second data state (e.g., logical "1").

Typically, an MTJ stack is disposed between a bottom electrode and a top electrode, and the reference layer, free layer, and barrier layer are manufactured to have a face-centered-cubic (fcc) structure with (111) orientation. To attempt to form the MTJ stack with this structure and orientation, the MTJ stack is grown from a seed layer. However, as appreciated in some aspects of the present disclosure, growing MTJ stacks from conventional seed layers result in imperfections in the MTJ stacks. For example, conventional MTJ stacks can exhibit a significant number of grain boundaries per unit area, and these grain boundaries make the MTJ stack susceptible to diffusive species, such as tantalum or ruthenium from the bottom electrode, diffusing into the MTJ stack for example from the bottom electrode. These grain boundaries can also degrade the quality of the fcc structure and (111) orientation for the MTJ stack, which can impair operating characteristics of the MTJ stack, especially over thermal stress and aging. Thus, among other features, the present disclosure provides a seed layer and MTJ stack that exhibit a higher quality lattice structure, which improves the operating characteristics (e.g., tunnel magnetoresistance (TMR) effect) of the MTJ stack.

FIG. 1A shows an MTJ device 100 in accordance with some embodiments. The MTJ device 100 includes an MTJ stack 102 disposed between a bottom electrode 106 and a top electrode 108. The MTJ stack 102 includes a reference layer 110 and a free layer 112, which are separated by a barrier layer 114. The reference layer 110 has a fixed magnetization, while the free layer 112 has a variable magnetization that can be switched to change between two binary data states for the MTJ device 100. A hard bias layer 116 is arranged below the reference layer 110 to fix the magnetization of the reference layer. An anti-parallel coupling (APC) layer 118 is arranged between the reference layer 110 and the hard bias layer 116. The APC layer 118 causes the magnetization of the reference layer 110 to be opposite that of the hard bias layer 116.

A sourceline (SL) is coupled to one end of the MTJ stack 102 through the top electrode 108, and a bitline (BL) is coupled to an opposite end of the MTJ stack 102 through an access transistor 104. The BL and sourceline can be flipped in other embodiments, such that the BL is coupled to the top electrode 108 and the sourceline is coupled to the bottom electrode 106 through the access transistor 104. Thus, application of a suitable wordline (WL) voltage to a gate electrode of the access transistor 104 couples the MTJ stack 102 between the BL and the SL. Consequently, by providing suitable bias conditions, the MTJ stack 102 can be switched between two states of electrical resistance to store data (see e.g., FIG. 1B discussed further below).

To allow well-structured formation of the MTJ stack 102, a seed layer 120 separates the bottom electrode 106 from the MTJ stack 102. The seed layer 120 has a strong fcc structure with (111) orientation to help the MTJ stack 102 grow so as to reduce the presence of small imperfections (e.g., grain boundaries) in the MTJ stack 102. This provides the MTJ with a higher-quality fcc (111) lattice than previously achievable and improves the TMR effect for the MTJ stack 102. For example, by limiting imperfections in the MTJ stack 102, the seed layer 120 helps prevent diffusive species (e.g., Ta and/or Ru) from diffusing from the bottom electrode 106 into the MTJ stack 102. Further, the seed layer 120 improves the crystalline structure of the MTJ stack 102, such that diffusion for layers containing diffusive species above the seed layer 120 is also reduced. For example, even if the reference layer 110 includes a diffusive species (e.g., Ta or Ru), the fact that the reference layer 110 was formed over the seed layer 120 (and not directly on the underlying bottom electrode 106) limits imperfections in the lattice of the MTJ stack 102 and consequently limits diffusion of the diffusive species through the MTJ stack 102. This helps limit the diffusive species from adversely affecting the TMR of the MTJ stack 102, and helps limit the degradation of the MTJ performance.

In some embodiments, the seed layer 120 is made of a crystalline nonmagnetic binary alloy of CrNi with a top surface that is planar or level. In other embodiments, the seed layer 120 is made of a crystalline non-magnetic ternary alloy of CrNiFe with a top surface that is planar or level. For example, in some cases, the composition of this seed layer 120 can be of the form $Cr_xNi_{1-x-y}Fe_y$, wherein x=0.1-0.5, y=0-0.2. In addition, the seed layer 120 can have a strong fcc (111) texture and be very thin, for example having a thickness ranging between 1 nm and 3 nm, which promotes good growth for the MTJ stack 102. Further, in some embodiments, the seed layer 120 may include a NiFe layer disposed over the top surface of the CrNi or CrNiFe.

Figure 1B:
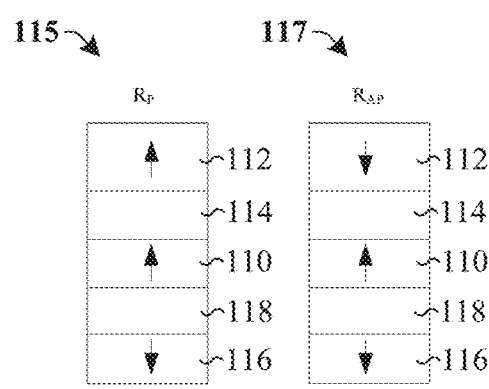
FIG. 1B illustrates a diagram illustrating some embodiments of how the magnetization of the layers in FIG. 1A can be changed to switch between a high-resistance state and a low-resistance state.

FIG. 1B shows example magnetizations of the reference layer 110, free layer 112, and hard bias layer 116 for a low-resistance state 115 and a high-resistance state 117. The low-resistance state 115 ($R_P$, which can for example correspond to a "0" state) occurs when the magnetization of the reference layer 110 and the free layer 112 are parallel (e.g., both pointing "up"), while the high-resistance state 117 ($R_{AP}$, which can for example correspond to a "1" state) occurs when the magnetization of reference layer 110 and free layer 112 are anti-parallel (e.g., one pointing "up" and the other pointing "down"). In this example, the magnetization of the hard bias layer 116 points "down" and the magnetization of the reference layer 110 is "up" and anti-parallel to that of the hard bias layer 116. However, in other embodiments the magnetization of the hard bias layer 116 could be flipped to point "up"; provided the magnetization of the reference layer 110 remains anti-parallel to that of the hard bias layer 116 (e.g., points "down"). Further, although FIG. 1B shows an example where the magnetizations are perpendicular to the planes in which the hard bias layer 116, reference layer 110, and free layer 112 are disposed; in-plane MTJs where the magnetizations are in parallel with the planes in which the hard bias layer 116, reference layer 110, and free layer 112 are disposed are also contemplated as falling within the scope of this disclosure. For example, the magnetization of the hard bias layer 116 could point "left" and the magnetization of the reference layer 110 could point "right"; with the magnetization of the free layer 112 being either parallel ("right") or anti-parallel ("left") to that of the reference layer 110.

Figure 2A:
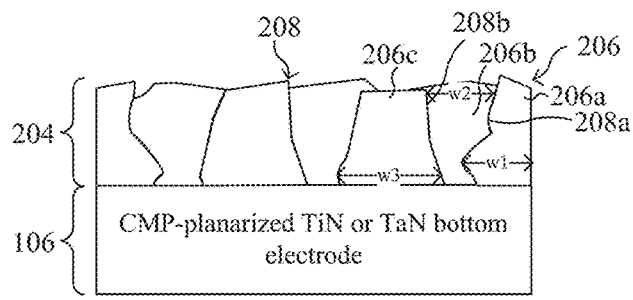
FIGS. 2A-2D illustrate cross-sectional views of some embodiments of forming a seed layer for an MTJ stack, according to the present disclosure.

FIGS. 2A-2D shows an example of some embodiments of how the seed layer 120 can be formed. In FIG. 2A, a CrNiFe layer 204 is deposited over a CMP-planarized titanium nitride (TiN) or tantalum nitride (TaN) bottom electrode 106. The CrNiFe layer 204 can be formed by plasma vapor deposition (PVD), for example. The CrNiFe layer 204 is made up of CrNiFe crystals 206 (e.g., individual CrNiFe crystals 206a, 206b, 206c). The CrNiFe crystals 206 have a (111) fcc lattice structure. These CrNiFe crystals 206 also have an initial average grain size, with a grain size for a CrNiFe crystal being the largest lateral distance measured between grain boundaries 208 surrounding that CrNiFe crystal and separating that CrNiFe crystal from other neighboring CrNiFe crystals. For example, first grain boundary 208a separates first CrNiFe crystal 206a from second CrNiFe crystal 206b; and second grain boundary 208b separates second CrNiFe crystal 206b from third CrNiFe crystal 206c. First CrNiFe crystal 206a has a first largest lateral distance (e.g., width w1); second CrNiFe crystal 206b has a second largest lateral distance (e.g., width w2); and third CrNiFe crystal 206c has a third largest lateral distance (e.g., width w3); with the initial average grain size of crystals 206a, 206b, and 206c being (w1+w2+w3)/3. In some embodiments, CrNi can be substituted in place of the CrNiFe, such that each individual crystal will be a CrNi crystal with grain boundaries separating individual CrNi crystals from one another.

Figure 2B:
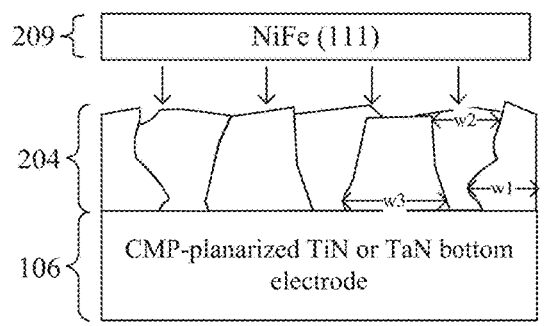

In FIG. 2B, a NiFe layer 209 is deposited, for example using PVD, over an upper surface of the CrNiFe layer 204. The NiFe layer 209 is deposited to have a strong fcc (111) orientation.

Figure 2C:
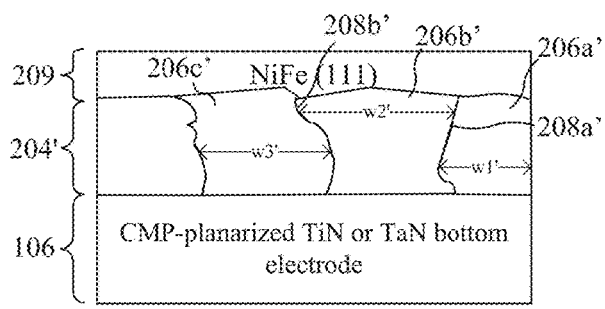

In FIG. 2C, it can be seen that when the NiFe layer 209 comes into contact with the underlying CrNiFe layer 204, the NiFe layer 209 induces the initial lattice structure of the CrNiFe layer 204 to recrystallize and form an enlarged crystal lattice structure of the CrNiFe layer 204'. This can be for example due to lattice strain arising from lattice mismatch between CrNiFe layer 204 and NiFe layer 209. In particular, the NiFe layer 209 increases the average grain size of the CrNiFe crystals 206 from the initial average grain size to an enlarged grain size. Thus, this change in the lattice structure reduces the number of grain boundaries 208 in the CrNiFe layer 204, and makes the lattice structure of the CrNiFe layer 204 more strongly fcc (111). For example, in some embodiments, the initial average grain size of CrNiFe crystals (based on widths w1, w2, and w3 in FIG. 2B) can be approximately 5 nm-20 nm, and the enlarged average grain size of CrNiFe crystals (based on largest lateral widths w1', w2', and w3' in FIG. 2C) can range from 20 nm-40 nm between outer sidewalls of each grain, with the increase in average grain size ranging from 5% to 120% in some embodiments.

Figure 2D:
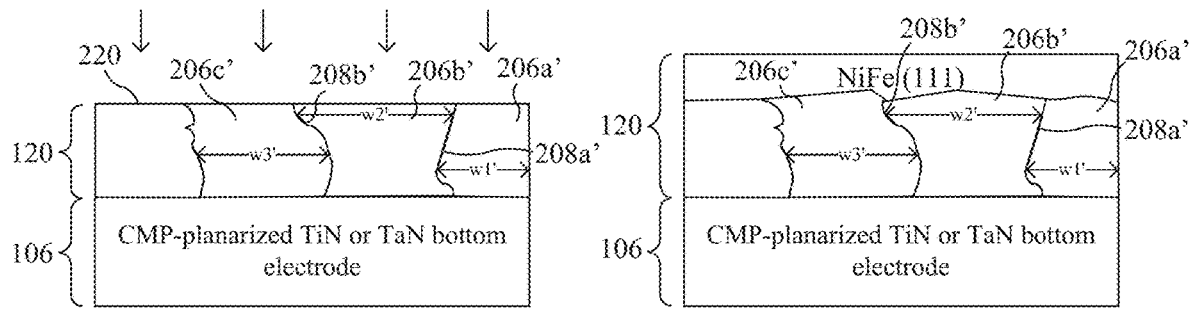

Referring to the left-hand side of FIG. 2D, the NiFe layer 209 can then be removed along with an upper portion of the CrNiFe layer 204', such that an upper surface 220 of the CrNiFe layer is planarized and now corresponds to an embodiment of the seed layer 120 in FIG. 1A. After planarization, the planarized CrNiFe layer 204" has a strongly fcc (111) lattice, and still has CrNiFe crystals 206 with the enlarged grain size. The hard bias layer (e.g., 116 in FIG. 1A) can then be formed in direct contact with the planarized upper surface of the CrNiFe layer, as shown in FIG. 1A. In some cases, the planarization routine in FIG. 2D also "thins" the CrNiFe layer, for example to a thickness ranging from 1 nm to 5 nm, and being about 2 nm in some embodiments. Thinning the CrNiFe layer 204 helps reduce the lateral "spread" of any grain boundaries, and also reduces the electrical resistance of the CrNiFe layer 204. In some embodiments, the left side of FIG. 2D is accomplished by carrying out a chemical mechanical planarization (CMP) operation whereby a polishing head applies downward pressure while rotating in the presence of a chemical slurry to planarize the upper surface 220 of the CrNiFe layer 204. In other embodiments, the left side of FIG. 2D is accomplished by sputtering off the NiFe layer (209 in FIG. 2C) and the upper portion of the CrNiFe layer (204 in FIG. 2C), by directing a stream of ions towards the structure at a non-normal angle and ejecting atoms of the NiFe layer 209 and CrNiFe layer 204. As shown in the right-hand portion of FIG. 2D, in some cases the NiFe layer 209 can also be left fully or partially in place, such that the seed layer 120 of FIG. 1A includes a CrNiFe layer 204' (or CrNi layer) with a NiFe layer 209 overtop, and the hard bias layer (FIG. 1A, 116) can be formed in direct contact with the upper surface of the NiFe layer 209. Leaving the NiFe layer 209 in place has a small drawback in that it tends to increase the resistance of the final seed layer, however, it also tends to simplify the manufacturing process somewhat. Portions of the NiFe layer 209 may be removed by CMP or sputtering, for example.

Figure 3A:
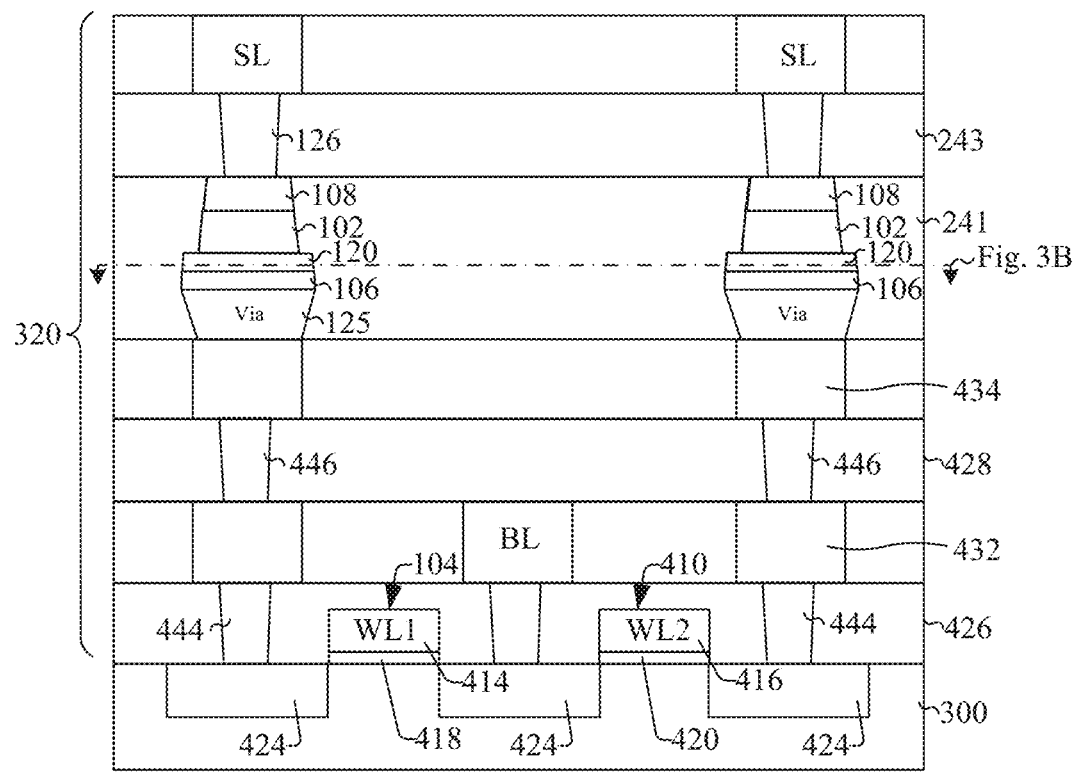
FIG. 3A illustrates a cross-sectional view of some embodiments of a memory device including two MRAM cells each having a magnetic tunneling junction (MTJ) formed over a seed layer, according to the present disclosure.

FIG. 3A illustrates a schematic cross-sectional view of MTJ stacks 102 sandwiched into an interconnect structure 320 on a semiconductor substrate 300. A lower interconnect via 125 is disposed over an interconnect-line stack 432/434, and is surrounded by an insulator layer 241. A bottom electrode 106 is disposed over the lower interconnect via 125. A top electrode 108 is disposed over the bottom electrode 106. The bottom electrode 106 is preferably made of a 5 nm thick tantalum nitride (TaN) film. The top electrode 108 is preferably made of a 5 nm thick titanium nitride (TiN) film. A top electrode via 126 is disposed over the MTJ stack 102, and is surrounded by an insulator layer 243.

The substrate 300 may be, for example, a bulk substrate (e.g., a bulk monocrystalline silicon substrate) or a silicon-on-insulator (SOI) substrate. Two access transistors 410, 104 are disposed in and/or over the substrate 300. The access transistors 410, 104 include gate electrodes 414, 416, respectively; gate dielectrics 418, 420, respectively; and source/drain regions 424. The source/drain regions 424 are disposed within the substrate 300, and are doped to have a first conductivity type which is opposite a second conductivity type of a channel region under the gate dielectrics 418, 420, respectively. The gate electrodes 414, 416 may be, for example, doped polysilicon or a metal, such as aluminum, copper, or combinations thereof. The gate dielectrics 418, 420 may be, for example, an oxide, such as silicon dioxide, or a high-κ dielectric material.

The interconnect structure 320 is arranged over the substrate 300 and couples devices (e.g., access transistors 410, 104) to one another. The interconnect structure 320 includes a plurality of inter-metal dielectric (IMD) layers (e.g., 426, 428), and a plurality of metallization layers (e.g., 432, 434) which are layered over one another in alternating fashion. The IMD layers 426, 428 may be made, for example, of a low κ dielectric, such as un-doped silicate glass, or an oxide, such as silicon dioxide, or an extreme low κ dielectric layer. The metallization layers 432, 434 include metal lines, which are formed within trenches, and which may be made of a metal, such as copper or aluminum. Contacts 444 extend from the bottom metallization layer 432 to the source/drain regions 424 and/or gate electrodes 414, 416; and vias (e.g., 446) extend between the metallization layers 432, 434. The contacts 444 and the vias 446 may be made of a metal, such as copper or tungsten, for example.

Figure 3B:
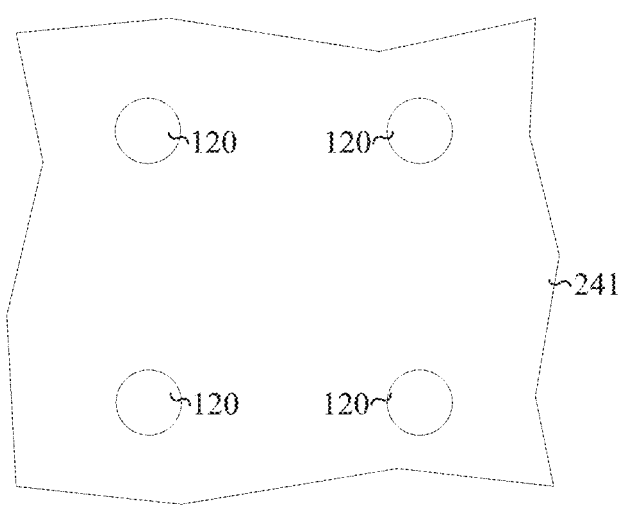
FIG. 3B illustrates top view of some embodiments of the memory device of FIG. 3A, according to the present disclosure.

MTJ stacks 102, which are configured to store respective data states, are arranged within the interconnect structure 320 between neighboring metal layers. The MTJ stack 102 is grown from a seed layer 120 over the bottom electrode 106. In some embodiments, the seed layer 120 is in the form of a pillar, which is only a single crystal, over each bottom electrode 106. As shown in the top view of FIG. 3B, in some cases the seed layer 120 can be round or circular as viewed from above. In other embodiments, the seed layer 120 can be square, square with rounded corners, rectangular, rectangular with rounded corners, or oval shaped as viewed from above.

Figure 4:
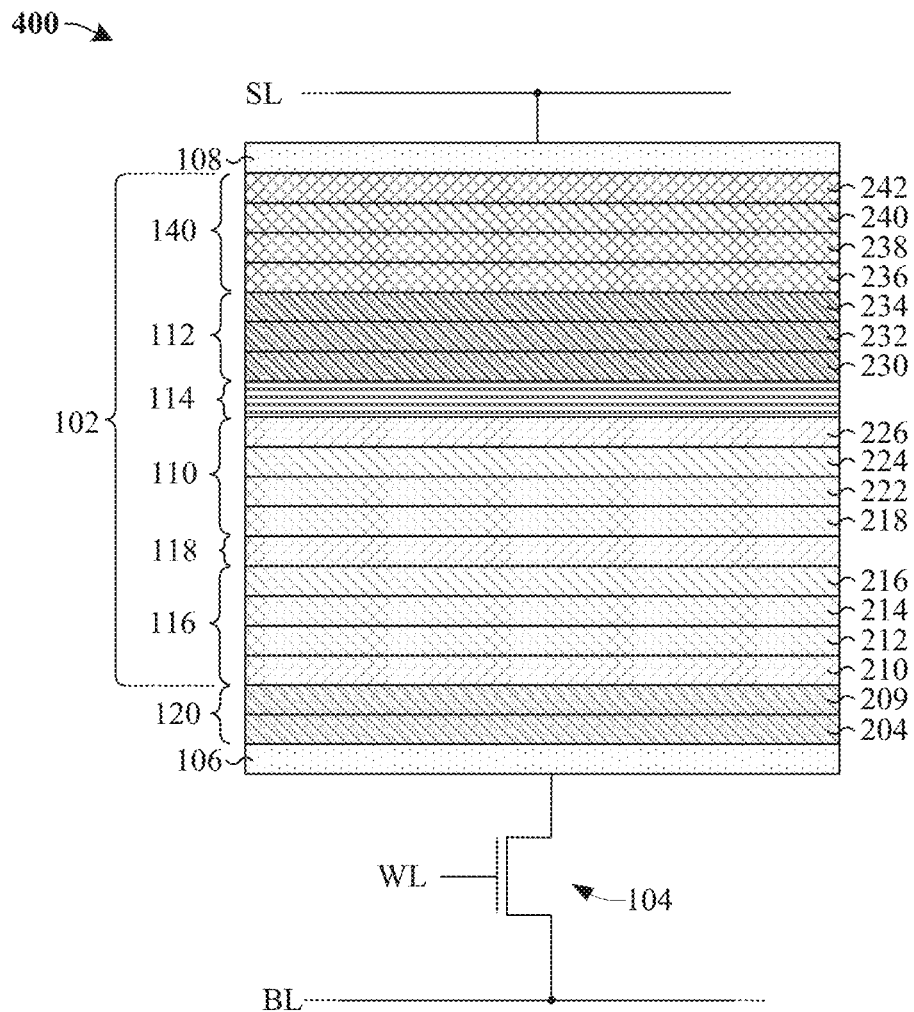
FIG. 4 illustrates a cross-sectional view of some embodiments of a more detailed memory device that includes a MTJ stack formed over a seed layer, according to the present disclosure.

FIG. 4 shows a more detailed example of a memory device 400 including an MTJ stack 102 in accordance with some embodiments. The MTJ stack 102 is disposed between the bottom electrode 106 and the top electrode 108. The MTJ stack includes a seed layer 120, a hard bias layer 116, an APC layer 118, a reference layer 110, a barrier layer 114, a free layer 112, and a capping layer 140.

In some embodiments, the bottom electrode 106 comprises tantalum (Ta), tantalum nitride (TaN), or ruthenium (Ru), for example. Although tantalum and ruthenium are transition metals, and hence conductive, tantalum and ruthenium may also be diffusive species with regards to the materials in the MTJ stack 102.

In some embodiments, the seed layer 120 includes a CrNiFe layer 204. In some embodiments, the CrNiFe layer 204 is made of or a crystalline non-magnetic ternary alloy of CrNiFe with a top surface that is planar or level. For example, in some cases, the composition of this crystalline layer 204 can be of the form $Cr_xNi_{1-x-y}Fe_y$, wherein x=0.1-0.5, y=0-0.2. In addition, the seed layer 120 can have a strong fcc (111) texture and be very thin, for example having a thickness ranging between 1 nm and 3 nm, which promotes good growth for the MTJ stack 102. In other embodiments, the CrNiFe layer 204 can be replaced by a nonmagnetic binary alloy of CrNi. A NiFe layer 209, which is optional, may also be present in some embodiments over an upper surface of the CrNiFe layer 204.

The hard bias layer 116 is a ferromagnetic material having a magnetization direction that is constrained or "fixed". This "fixed" magnetization direction can be achieved in some cases by exposing the chip to a high magnetic field after the entire chip is manufactured. In some embodiments, the hard bias layer 116 comprises a laminated structure of N repeats of alternating layers of Co and platinum (Pt). In some embodiments, N is a whole number greater than one, in some embodiments N is 5, in alternative embodiments N is within a range of approximately 5 and 20, or some other suitable number. In the illustrated embodiment, the hard bias layer 116 comprises a first hard bias layer 210 disposed over and in direct contact with an upper surface of the seed layer 120, a second hard bias layer 212 disposed over the first hard bias layer 210, a first cobalt (Co) layer 214 over the second hard bias layer 212, and a third hard bias layer 216 disposed over the first Co layer 214. In some embodiments, the first hard bias layer 210 is comprised of cobalt nickel (CoNi), cobalt palladium (CoPd) or cobalt platinum (CoPt), or the first hard bias layer 210 is comprised of a multilayer stack of the aforementioned materials. In some embodiments, the second hard bias layer 212 is comprised of nickel (Ni), palladium (Pd), or platinum (Pt). In some embodiments, the third hard bias layer 216 is comprised of nickel (Ni), palladium (Pd), or Pt. In some embodiments, layers within the hard bias layer 116 are respectively formed to a thickness of 0.3 nm or within a range of 0.2 nm to 0.4 nm.

The anti-parallel coupling (APC) layer 118 is arranged over the hard bias layer 116, and separates the hard bias layer 116 from the reference layer 110. The APC layer 118 ensures that the magnetization of the reference layer 110 is the opposite that of the hard bias layer 116 through exchange bias coupling effect. In some embodiments, the APC layer 118 is made of Ru formed to a thickness of 0.4 nanometers or within a range of approximately 0.3 nanometers to approximately 0.5 nanometers, or is made of iridium (Ir) formed to a thickness of 0.5 nanometers or within a range of approximately 0.4 nanometers to approximately 0.6 nanometers.

The reference layer 110 is a ferromagnetic layer that has also a magnetization direction that is "fixed". However, the magnetization direction of the reference layer 110 is opposite to that of the hard bias layer 116. The reference layer 110 comprises a second cobalt layer 218 formed over the APC layer 118, and a first cobalt iron boron (CoFeB) layer 222 disposed over the second cobalt layer 218. A first molybdenum (Mo) or tungsten (W) layer 224 is disposed over the first CoFeB layer 222, and a second CoFeB layer 226 is disposed over the first molybdenum (Mo) or tungsten (W) layer 224. In some embodiments, layers within the reference layer 110 are respectively formed to a thickness of 0.3 nm, 0.8 nm, 1 nm, or within a range of 0.15 nm to 1.5 nm.

The barrier layer 114, which can manifest as a thin dielectric layer or non-magnetic metal layer in some cases, separates the reference layer 110 from the free layer 112. In some embodiments, the barrier layer 114 can comprise an amorphous barrier, such as aluminum oxide ($AlO_x$) or titanium oxide ($TiO_x$), or a crystalline barrier, such as manganese oxide (MgO) or a spinel (e.g., $MgAl_2O_4$). The barrier layer 114 may also comprise, for example, aluminum oxide (e.g., $Al_2O_3$), nickel oxide, gadolinium oxide, tantalum oxide, molybdenum oxide, titanium oxide, tungsten oxide, or the like. In embodiments where the ferromagnetic memory stack is a magnetic tunnel junction (MTJ), the barrier layer 114 is a tunnel barrier layer which is thin enough to allow quantum mechanical tunneling of current between the reference layer 110 and the free layer 112.

The free layer 112 is capable of changing its magnetization direction between one of two magnetization states, which correspond to binary data states stored in the memory cell. In the illustrated embodiment, the free layer 112 comprises a third CoFeB layer 230 disposed over the barrier layer 114, a first free layer 232 disposed over the third CoFeB layer 230, and a fourth CoFeB layer 234 disposed over the first free layer 232. In some embodiments, the first free layer 232 comprises molybdenum (Mo) or tungsten (W). In some embodiments, layers within the free layer 112 are respectively formed to a thickness of 0.2 nm, 1 nm, or within a range of 0.10 nm to 1.5 nm. In some embodiments, the free layer 112 comprises iron, cobalt, nickel, iron cobalt, nickel cobalt, cobalt iron boride, iron boride, iron platinum, iron palladium, or the like.

The capping layer 140, which may also be referred to as a perpendicular magnetic anisotropy (PMA) protection layer in some contexts, is disposed over the free layer 112. The capping layer 140 often enhances anisotropy for the MTJ stack, or protects it from degrading when the stack is built up. It will be appreciated that the capping layer 140 can take many forms, and thus FIG. 4 is merely an example. The capping layer 140 comprises a capping magnesium oxide (MgO) layer 236 disposed over the fourth CoFeB layer 234, a capping CoFeB layer 238 disposed over the capping MgO layer 236, a first capping layer 240 disposed over the capping CoFeB layer 238, and a second capping layer 242 disposed over the first capping layer 240. In some embodiments, the first capping layer 240 comprises molybdenum (Mo) or tungsten (W). In some embodiments, layers within the capping layer 140 are respectively formed to thicknesses of 0.4 nm, 0.6 nm, 2 nm, or within a range of 0.20 nm to 3 nm. In some embodiments, the capping layer 140 comprises ruthenium (Ru) formed to a thickness of 6 nm or within a range of 3 nm and 9 nm.

FIGS. 5-11 illustrate cross-sectional views 500-1100 of some embodiments of a method of forming a memory device including a MRAM cell comprising a MTJ according to the present disclosure. Although the cross-sectional views 500-1100 shown in FIGS. 5-11 are described with reference to a method, it will be appreciated that the structures shown in FIGS. 5-11 are not limited to the method but rather may stand alone separate of the method. Although FIGS. 5-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
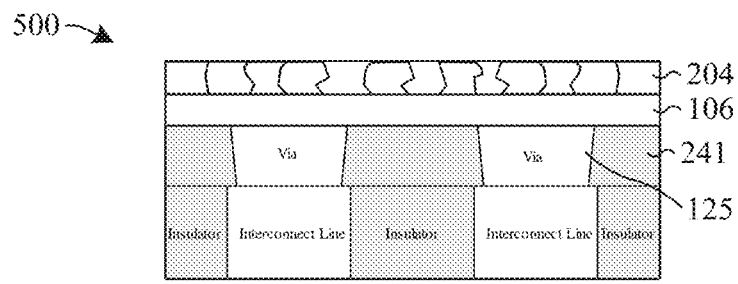
FIGS. 5-11 illustrate cross-sectional views of some embodiments of a method of forming a memory device including a MRAM cell having a MTJ, according to the present disclosure.

As shown in cross-sectional view 500 of FIG. 5, an interconnect via 125 is formed within a second dielectric layer 241. A bottom electrode layer 106, which can for example be made of tantalum nitride, is formed over the interconnect via 125. A seed layer precursor 204, which can for example be made of NiCr or NiCrFe, is formed over the bottom electrode layer 106. The seed layer precursor 204 can be formed by plasma vapor deposition (PVD), for example. The seed layer precursor 204 is made up of distinct crystals which have a (111) fcc lattice structure, and are separated by grain boundaries between nearest neighbor crystals, such as previously described in FIG. 2A for example.

Figure 6:
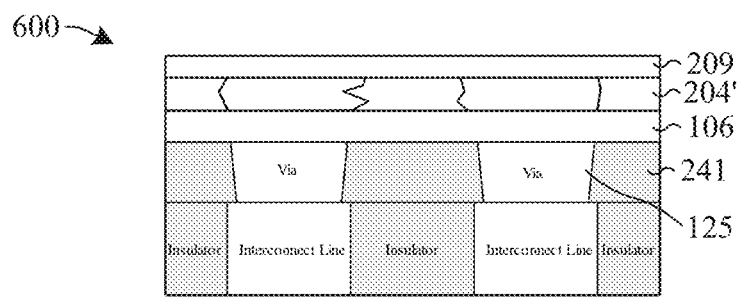

As shown in cross-sectional view 600 of FIG. 6, a re-crystallization-inducing layer 209 is then formed, for example by PVD, over the seed layer precursor. The re-crystallization-inducing layer 209 can comprise NiFe in some embodiments, and can have a strong (111) fcc lattice structure. When the re-crystallization-inducing layer 209 comes into contact with the underlying seed layer precursor, the re-crystallization-inducing layer 209 induces the initial lattice structure of the seed layer precursor to recrystallize, thereby establishing a seed layer 120 with a layer 204' with enlarged crystalline grains, such as previously described in FIG. 2C for example. In some embodiments, the re-crystallization-inducing layer 209 can be partially or fully removed, though it is illustrated as remaining in place in FIG. 7-11 as an example.

Figure 7:
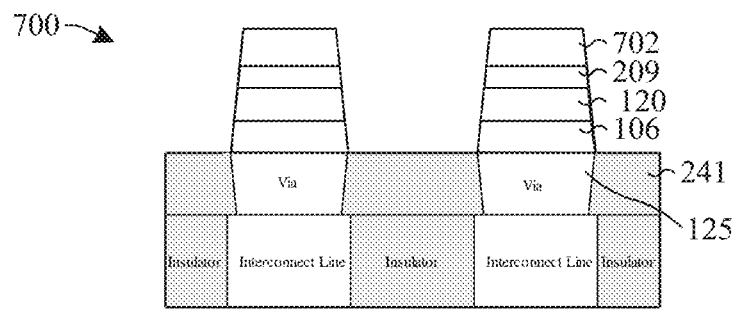

As shown in cross-sectional view 700 of FIG. 7, a hardmask layer 702, for example made of titanium nitride, is then formed and patterned over the re-crystallization-inducing layer 209. An etch is then performed with the hardmask layer 702 in place to form a bottom electrode structure 106, and a pillar corresponding to a seed layer structure 120 over each bottom electrode. In some embodiments, the enlarged crystal lattice structure of the seed layer structure 120 in conjunction with the patterning and etching in FIG. 7 results in the seed layer structure 120 including only a single crystal over each bottom electrode, which can help to improve the quality of the fcc (111) lattice structure of the MTJ to be formed. Further, the sidewalls of the bottom electrode 106, seed layer structure 120, and the re-crystallization-inducing layer 209, can be tapered at the same angle as one another so as to be aligned and/or coplanar. Further the sidewalls of the bottom electrode 106, seed layer structure 120, and the re-crystallization-inducing layer 209 may be angled in a direction that is opposite to sidewalls of the via 125. For example, the sidewall angle of the bottom electrode 106 may be approximately 80-degrees to 90-degrees relative to top surface of via 125, while the sidewall angle of the via 125 may be approximately negative 80-degrees to negative 90-degrees relative to top surface of via 125.

Figure 8:
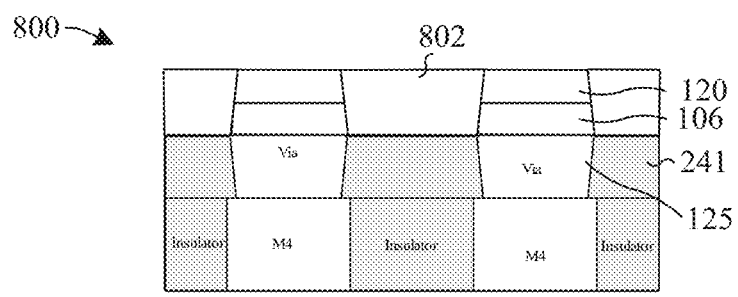

As shown in cross-sectional view 800 of FIG. 8, a passivation or CMP-stop layer 802, which for example can be made of silicon nitride, is formed over the structure. A (CMP) process is then performed. The CMP process can optionally fully or partially remove the re-crystallization-inducing layer (209 FIG. 7), and can thin the seed layer structure 120 from its initial thickness to non-zero, thinned thickness, in some embodiments.

Figure 9:
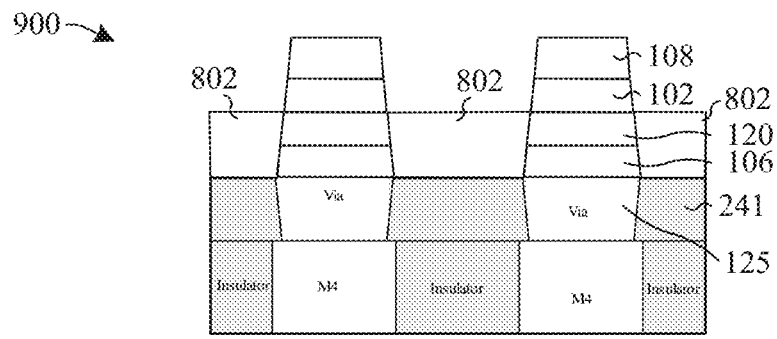

As shown in cross-sectional view 900 of FIG. 9, a MTJ stack 102 is then grown from the seed layer structure 120, and a top electrode 108, such as made of titanium nitride for example, is formed over the MTJ stack 102. Typically, the MTJ stack 102 and top electrode 108 are formed and are then patterned using lithography techniques.

Figure 10:
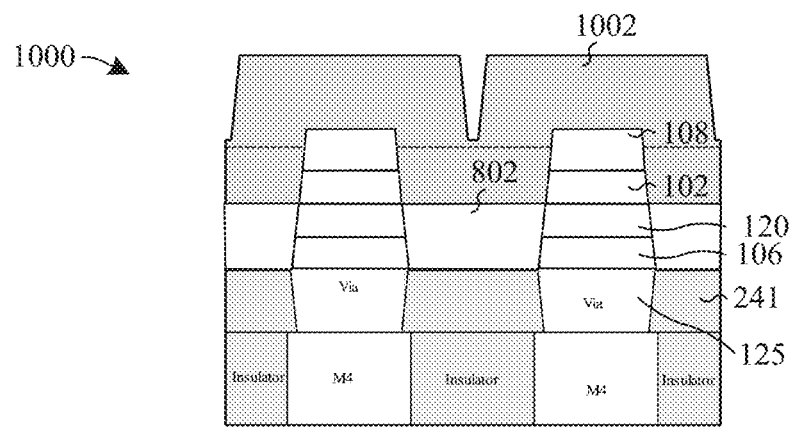

As shown in cross-sectional view 1000 of FIG. 10, an insulator layer 1002, such as a low-k dielectric material, is then formed over the top electrode 108 and along sidewalls of the MTJ stack 102.

Figure 11:
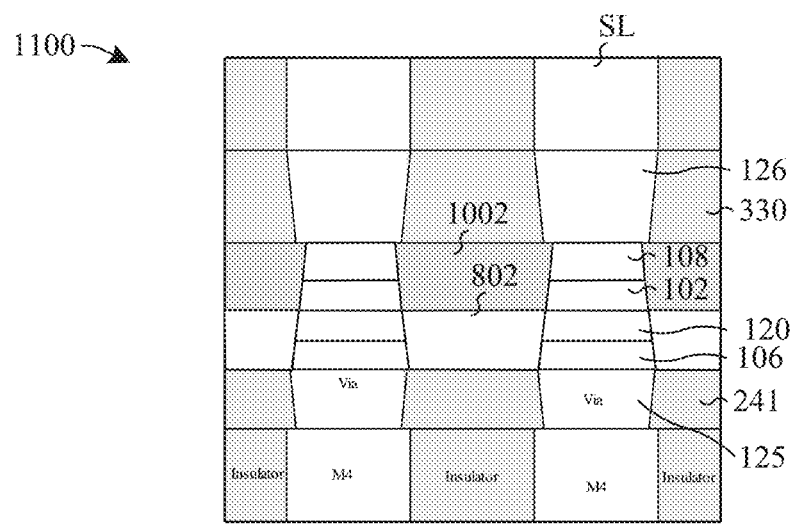

As shown in cross-sectional view 1100 of FIG. 11, a chemical mechanical planarization (CMP) process is performed on the top electrode 108 and insulator layer 1002. An upper insulator layer 330 is formed over the top electrode 108 and insulator layer 1002. A top electrode via 126 is formed over the top electrode 108. A conductive wire, such as a sourceline SL, is formed over the top electrode via 126.

Figure 12:
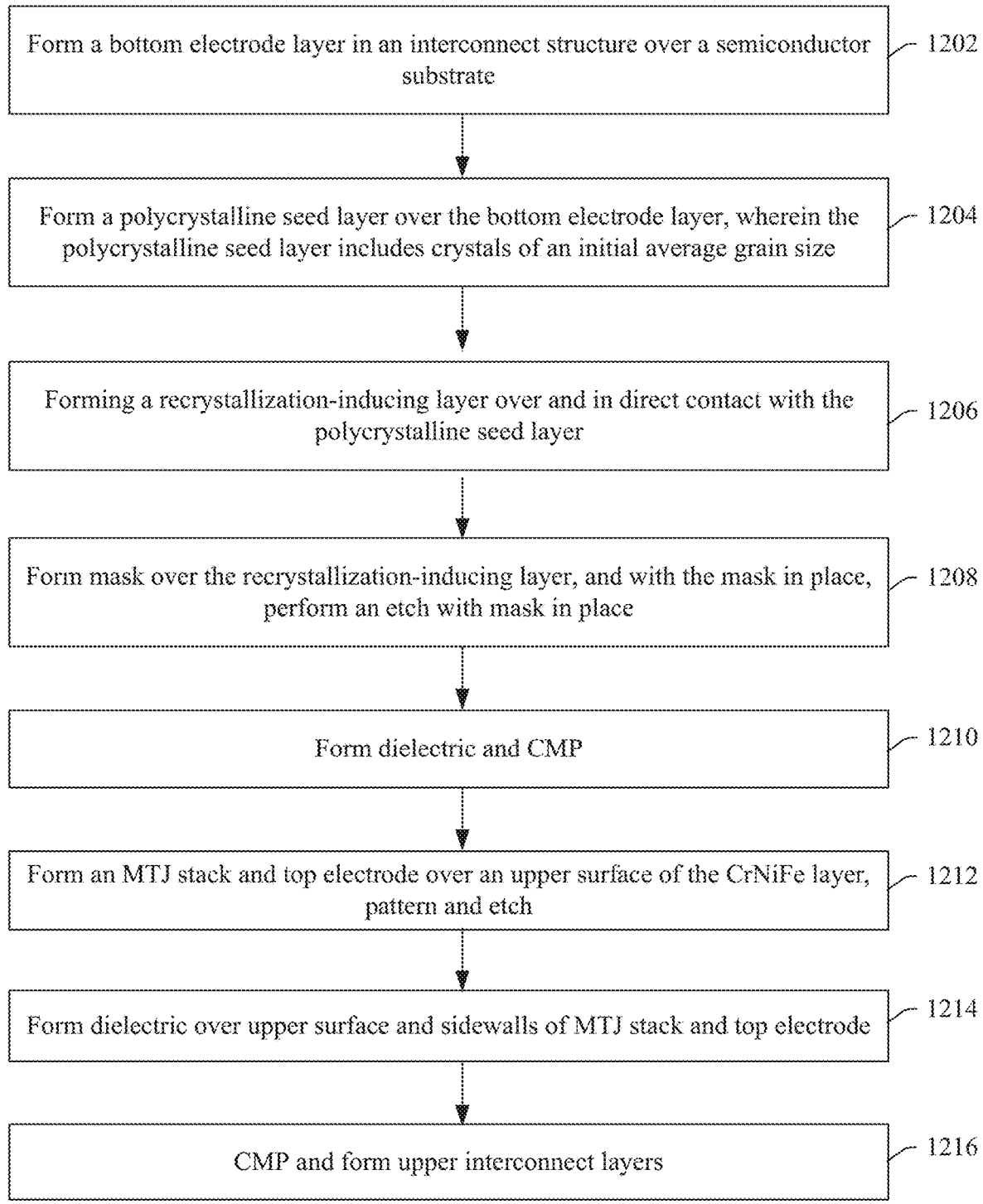
FIG. 12 illustrates a methodology in flowchart format that illustrates some embodiments of a method of forming an MRAM cell over a seed layer, according to the present disclosure.

With reference to FIG. 12, a block diagram 1200 of some embodiments of the method of FIGS. 5-11 is provided.

In 1202, a bottom electrode layer is formed in an interconnect structure over a semiconductor substrate. In some embodiments the bottom electrode layer is a TaN or TiN layer; and in some embodiments 1202 can correspond to FIG. 5 as previously discussed.

In 1204, a polycrystalline seed layer, for example made of CrNiFe, is formed over the bottom electrode layer. When initially formed, the crystals of the polycrystalline seed layer exhibit an initial average grain size. In some embodiments 1204 can correspond to FIG. 5 as previously discussed.

In 1206, a recrystallization-inducing layer, for example made of NiFe, is formed over and in direct contact with the polycrystalline seed layer. Formation of the NiFe layer induces recrystallization of the polycrystalline layer to establish a re-crystallized polycrystalline layer. The crystals of the recrystallized polycrystalline layer exhibit enlarged crystals that have an enlarged average grain size that is larger than the initial average grain size. In some embodiments 1206 can correspond to FIG. 6 as previously discussed.

In 1208, a mask is formed over the recrystallization-inducing layer, and with the mask in place, an etch is performed to remove portions of the recrystallization-inducing layer, the recrystallized polycrystalline layer, and the bottom electrode layer. In some embodiments, 1208 can correspond to FIG. 7 as previously discussed.

In 1210, a dielectric layer is formed over the structure and CMP is performed. In some embodiments 1210 can correspond to FIG. 8 as previously discussed.

In 1212, an MTJ stack and top electrode are formed over an upper surface of the recrystallized polycrystalline layer. The MTJ stack and top electrode are then patterned and etched using photolithography techniques, for example. In some embodiments 1212 can correspond to FIG. 9 as previously discussed.

In 1214, a dielectric is formed over an upper surface and sidewalls of the MTJ stack and top electrode. In some embodiments 1214 can correspond to FIG. 10 as previously discussed.

In 1216, CMP is performed and upper interconnect layers are formed, for example, as previously illustrated and discussed with regard to in FIG. 11.

Some embodiments relate to a semiconductor device, including: a bottom electrode disposed over a semiconductor substrate; a magnetic tunnel junction (MTJ) stack disposed over the bottom electrode; and a conductive seed layer including a CrNiFe layer or CrNi layer disposed separating the bottom electrode from the MTJ stack. The conductive seed layer includes $Cr_xNi_{1-x-y}Fe_y$, wherein $x=0.1$-$0.5$, $y=0$-$0.2$. In some embodiments, a thickness of the conductive seed layer as defined between a top surface of the bottom electrode and a bottom surface of the MTJ stack is between 1 nm and 3 nm. In some embodiments, the conductive seed layer includes: a CrNiFe layer disposed directly on the bottom electrode; and a NiFe layer in direct contact with a top surface of the CrNiFe layer. In some embodiments, the MTJ stack includes: a hard bias layer disposed over the conductive seed layer; a reference layer disposed over the hard bias layer; an anti-parallel coupling (APC) layer separating the hard bias layer from the reference layer; a barrier layer over the reference layer; a free layer over the barrier layer; and a capping layer disposed over the free layer. In some embodiments, the semiconductor device also includes a top electrode disposed over the capping layer; and a top electrode via disposed over the top electrode. In some embodiments, the bottom electrode is formed over and is electrically coupled to a via, wherein sidewalls of the bottom electrode and the conductive seed layer are angled in a first direction that is opposite to a second direction in which sidewalls of the via are angled. In some embodiments, the conductive seed layer includes only a single CrNiFe crystal between the bottom electrode and the MTJ stack.

Some embodiments relate to method. In the method a bottom electrode layer is formed; a polycrystalline CrNiFe layer is formed over the bottom electrode layer, wherein the polycrystalline CrNiFe layer includes CrNiFe crystals having an initial average grain size; and a NiFe layer is formed over and in direct contact with the polycrystalline CrNiFe layer wherein formation of the NiFe layer induces recrystallization of the polycrystalline CrNiFe layer to establish a recrystallized polycrystalline CrNiFe layer, wherein the recrystallized polycrystalline CrNiFe layer includes enlarged CrNiFe crystals having an enlarged average grain size that is larger than the initial average grain size. In some embodiments, the method further includes forming a mask over the recrystallized polycrystalline CrNiFe layer; and removing portions of the recrystallized polycrystalline CrNiFe layer and bottom electrode layer to establish a patterned recrystallized polycrystalline CrNiFe structure and bottom electrode structure, wherein the patterned recrystallized polycrystalline CrNiFe structure consists of a single CrNiFe crystal over the bottom electrode structure. In some embodiments, the method further includes removing the NiFe layer from over the recrystallized polycrystalline CrNiFe layer and thinning the recrystallized polycrystalline CrNiFe layer; and after the NiFe layer has been removed, forming an MTJ stack in direct contact with an upper surface of the thinned recrystallized polycrystalline CrNiFe layer. In some embodiments, forming the MTJ stack includes: forming a hard bias layer over the polycrystalline CrNiFe layer; forming an anti-parallel coupling (APC) layer over the hard bias layer; forming a reference layer over the APC layer; forming a barrier layer over the reference layer; and forming a free layer over the barrier layer. In some embodiments, the method further includes forming a mask over the MTJ stack, and removing portions of the MTJ stack so a patterned MTJ stack remains in place over the recrystallized polycrystalline CrNiFe layer. In some embodiments, the method further includes forming an MTJ stack in direct contact with an upper surface of the NiFe layer. In some embodiments, the bottom electrode layer is formed over and is electrically coupled to a via, wherein sidewalls of the bottom electrode, seed layer structure, and re-crystallization-inducing layer are angled in a direction that is opposite to sidewalls of the via.

Still other embodiments relate to a semiconductor device that includes an interconnect structure disposed over a semiconductor substrate. A bottom electrode is disposed over the semiconductor substrate within the interconnect structure. A conductive seed layer including a CrNiFe layer or a CrNi layer is disposed on the bottom electrode. A magnetic tunnel junction (MTJ) is disposed over the conductive seed layer and is separated from the bottom electrode by the conductive seed layer. A top electrode is disposed over the MTJ. In some embodiments, the bottom electrode layer is formed over and electrically coupled to a via in the interconnect structure, wherein sidewalls of the bottom electrode, seed layer structure, and re-crystallization-inducing layer are angled in a direction that is opposite to sidewalls of the via. In some embodiments, the conductive seed layer includes only a single CrNiFe crystal separating the bottom electrode and the MTJ. In some embodiments, the conductive seed layer includes $Cr_xNi_{1-x-y}Fe_y$, wherein x=0.1-0.5, y=0-0.2. In some embodiments, a thickness of the conductive seed layer as defined between a top surface of the bottom electrode and a bottom surface of the MTJ stack is between 1 nm and 3 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a bottom electrode disposed over a semiconductor substrate;
   a magnetic tunnel junction (MTJ) stack disposed over the bottom electrode; and
   a conductive seed layer comprising a CrNiFe layer or CrNi layer separating the bottom electrode from the MTJ stack, the CrNiFe layer or CrNi layer comprising one or more crystals each having a maximum lateral width, where an average maximum lateral width of the one or more crystals is over 20 nanometers.

2. The semiconductor device of claim 1, wherein the conductive seed layer comprises $Cr_xNi_{1-x-y}Fe_y$, wherein x=0.1-0.5, y=0-0.2.

3. The semiconductor device of claim 1, wherein a thickness of the conductive seed layer as defined between a top surface of the bottom electrode and a bottom surface of the MTJ stack is between 1 nm and 3 nm.

4. The semiconductor device of claim 1, wherein the conductive seed layer comprises:
   a CrNiFe layer disposed directly on the bottom electrode; and
   a NiFe layer in direct contact with a top surface of the CrNiFe layer.

5. The semiconductor device of claim 1, wherein the MTJ stack comprises:
   a hard bias layer disposed over the conductive seed layer;
   a reference layer disposed over the hard bias layer;
   an anti-parallel coupling (APC) layer separating the hard bias layer from the reference layer;
   a barrier layer over the reference layer;
   a free layer over the barrier layer; and
   a capping layer disposed over the free layer.

6. The semiconductor device of claim 5, further comprising:
   a top electrode disposed over the capping layer; and
   a top electrode via disposed over the top electrode.

7. The semiconductor device of claim 1, wherein the bottom electrode is formed over and is electrically coupled to a via, wherein sidewalls of the bottom electrode and the conductive seed layer are angled in a first direction that is opposite to a second direction in which sidewalls of the via are angled.

8. The semiconductor device of claim 1, wherein the conductive seed layer includes only a single CrNiFe crystal between the bottom electrode and the MTJ stack.

9. The semiconductor device of claim 1, wherein the one or more crystals each have a maximum height, and the average maximum lateral width of the one or more crystals is over three times an average maximum lateral height of the one or more crystals.

10. A method, comprising:
forming a bottom electrode layer;
forming a polycrystalline CrNiFe layer over the bottom electrode layer, wherein the polycrystalline CrNiFe layer includes CrNiFe crystals having an initial average grain size; and
forming a NiFe layer over and in direct contact with the polycrystalline CrNiFe layer wherein forming the NiFe layer induces recrystallization of the polycrystalline CrNiFe layer to establish a recrystallized polycrystalline CrNiFe layer, wherein the recrystallized polycrystalline CrNiFe layer includes enlarged CrNiFe crystals having an enlarged average grain size that is larger than the initial average grain size.

11. The method of claim 10, further comprising:
forming a mask over the recrystallized polycrystalline CrNiFe layer; and
removing portions of the recrystallized polycrystalline CrNiFe layer and bottom electrode layer to establish a patterned recrystallized polycrystalline CrNiFe structure and bottom electrode structure, wherein the patterned recrystallized polycrystalline CrNiFe structure consists of a single CrNiFe crystal over the bottom electrode structure.

12. The method of claim 10, further comprising:
removing the NiFe layer from over the recrystallized polycrystalline CrNiFe layer and thinning the recrystallized polycrystalline CrNiFe layer; and
after the NiFe layer has been removed, forming an MTJ stack in direct contact with an upper surface of the thinned recrystallized polycrystalline CrNiFe layer.

13. The method of claim 12, wherein forming the MTJ stack comprises:
forming a hard bias layer over the polycrystalline CrNiFe layer;
forming an anti-parallel coupling (APC) layer over the hard bias layer;
forming a reference layer over the APC layer;
forming a barrier layer over the reference layer; and
forming a free layer over the barrier layer.

14. The method of claim 12, further comprising:
forming a mask over the MTJ stack, and removing portions of the MTJ stack so a patterned MTJ stack remains in place over the recrystallized polycrystalline CrNiFe layer.

15. The method of claim 11, further comprising:
forming an MTJ stack in direct contact with an upper surface of the NiFe layer.

16. The method of claim 10, wherein the bottom electrode layer is formed over and is electrically coupled to a via, wherein sidewalls of the bottom electrode layer, seed layer structure, and re-crystallization-inducing layer are angled in a direction that is opposite to sidewalls of the via.

17. A semiconductor device, comprising:
a semiconductor substrate;
an interconnect structure disposed over the semiconductor substrate;
a bottom electrode disposed over the semiconductor substrate within the interconnect structure;
a conductive seed layer comprising a CrNiFe layer or a CrNi layer disposed on the bottom electrode;
a magnetic tunnel junction (MTJ) disposed over the conductive seed layer and separated from the bottom electrode by the conductive seed layer; and
a top electrode disposed over the MTJ;
wherein the conductive seed layer includes only a single CrNiFe crystal separating the bottom electrode and the MTJ.

18. The semiconductor device of claim 17, wherein the bottom electrode is formed over and electrically coupled to a via in the interconnect structure, wherein sidewalls of the bottom electrode, seed layer structure, and re-crystallization-inducing layer are angled in a direction that is opposite to sidewalls of the via.

19. The semiconductor device of claim 17, wherein the conductive seed layer comprises $Cr_xNi_{1-x-y}Fe_y$, wherein $x=0.1$-$0.5$, $y=0$-$0.2$.

20. The semiconductor device of claim 17, wherein a thickness of the conductive seed layer as defined between a top surface of the bottom electrode and a bottom surface of the MTJ is between 1 nm and 3 nm.

* * * * *